United States Patent
Beeke et al.

(10) Patent No.: US 10,146,253 B2
(45) Date of Patent: Dec. 4, 2018

(54) COMBINED SLOT AND BACKPLANE IDENTIFICATION

(71) Applicant: epro GmbH, Gonau (DE)

(72) Inventors: Hermann Beeke, Gescher (DE); Raphael Wittmund, Heek (DE)

(73) Assignee: epro GmbH, Gronau (DE)

( * ) Notice: Subject to any disclaimer, the term of this patent is extended or adjusted under 35 U.S.C. 154(b) by 296 days.

(21) Appl. No.: 15/065,973

(22) Filed: Mar. 10, 2016

(65) Prior Publication Data
US 2017/0262012 A1 Sep. 14, 2017

(51) Int. Cl.
| G06F 13/00 | (2006.01) |
| G06F 1/16 | (2006.01) |
| G01R 15/04 | (2006.01) |
| G01R 19/00 | (2006.01) |
| G06F 1/18 | (2006.01) |
| H05K 7/14 | (2006.01) |

(52) U.S. Cl.
CPC ............. *G06F 1/16* (2013.01); *G01R 15/04* (2013.01); *G01R 19/0084* (2013.01); *G06F 1/185* (2013.01); *H05K 7/1498* (2013.01)

(58) Field of Classification Search
CPC ........ G06F 1/16; G01R 15/04; G01R 19/0084
See application file for complete search history.

(56) References Cited

U.S. PATENT DOCUMENTS

| 6,564,278 | B1 | 5/2003 | Olson |
| 6,614,811 | B1 | 9/2003 | Alaimo et al. |
| 6,862,644 | B1 | 3/2005 | Pendleton et al. |
| 8,583,847 | B2 | 11/2013 | Indrani et al. |
| 9,164,862 | B2 | 10/2015 | Indrani et al. |
| 2008/0042701 | A1* | 2/2008 | Weiss .................. H05K 1/0266 327/143 |

* cited by examiner

*Primary Examiner* — Minh Q Phan
(74) *Attorney, Agent, or Firm* — Luedeka Neely Group, P.C.; Rick Barnes

(57) ABSTRACT

An identification circuit for determining a chassis identification and a slot identification within the chassis using a single reading. The circuit includes a first electrical component associated with a first slot of a first chassis, where the first electrical component has a first value. A second electrical component is associated with a second slot of the first chassis, where the second electrical component has a second value that is different from the first value. A removable card has a third electrical component with a third value, where the removable card inserts into a selected one of the first slot and the second slot of the first chassis. A measuring circuit measures an interaction between the third electrical component and the associated one of the first electrical component and the second electrical component, where the interaction has a fourth value. The fourth value of the interaction identifies both the first chassis and the selected slot into which the removable card is inserted.

18 Claims, 3 Drawing Sheets

| Slot | Chassis 1 $R_{(1,y)}$ | Chassis 2 $R_{(2,y)}$ | $V_{in}$ | $R_c$ | Chassis 1 $V_{out}$ | Chassis 2 $V_{out}$ |
|---|---|---|---|---|---|---|
| 126a | 1Ω | 20Ω | 10v | 10Ω | 0.9v | 6.7v |
| 126b | 3Ω | 30Ω | 10v | 10Ω | 2.3v | 7.5v |
| 126c | 5Ω | 50Ω | 10v | 10Ω | 3.3v | 8.3v |
| 126d | 7Ω | 70Ω | 10v | 10Ω | 4.1v | 8.75v |
| 126e | 9Ω | 90Ω | 10v | 10Ω | 4.7v | 9.0v |
| 126f | 11Ω | 110Ω | 10v | 10Ω | 5.2v | 9.2v |

*FIG. 3*

COMBINED SLOT AND BACKPLANE IDENTIFICATION

FIELD

The present invention relates generally to electronic instruments or computing devices, and more particularly to backplane technology.

BACKGROUND

A backplane system includes a set of connectors that are disposed on a common plane—a backplane—and removable cards that plug into the connectors, such as memory cards, storage cards, processor cards, interface cards, interconnections with other backplanes, and the like (all generally referred to as cards herein). Typically, the connector provides to the inserted card everything that the card needs to function, such as power and access to system buses and other connections. In this manner, the cards can be easily inserted and removed as needed, such as to replace damaged cards, add redundancy, add capacity, or add new features to the system.

The backplane portion can be a chassis, which is often a relatively passive device that provides services to the cards, or can also be a more active device such as a motherboard. The term chassis is used herein as shorthand to include all such backplane devices, whether active or passive.

It is sometimes important for a given card to know the address of the slot on the chassis into which it is inserted, which can be accomplished by means of a slot coding mechanism. A well-known way to identify a slot is to measure the voltage that results from a voltage divider with one resistor on the card and the other resistor assigned to one of the pins in the slot on the chassis. Each slot has a different resistor value, so the card can determine the slot address via a simple voltage measurement.

However, sometimes it is also important for a given card to know the type, address, or some other identifier of the chassis into which it is inserted, so that it can properly function with the chassis. Currently, a second code mechanism is required to identify the chassis. The second code mechanism uses a second resistor on a second pin of the slot. Other methods use active components, like an EEPROM, to store the identifying information on the chassis. Both of these methods require additional interfaces, pins, and hardware.

What is needed, therefore, is a system that reduces issues such as those described above, at least in part.

SUMMARY

The above and other needs are met by an identification circuit for determining a chassis identification and a slot identification within the chassis using a single reading. The circuit includes a first electrical component associated with a first slot of a first chassis, where the first electrical component has a first value. A second electrical component is associated with a second slot of the first chassis, where the second electrical component has a second value that is different from the first value. A removable card has a third electrical component with a third value, where the removable card inserts into a selected one of the first slot and the second slot of the first chassis. A measuring circuit measures an interaction between the third electrical component and the associated one of the first electrical component and the second electrical component, where the interaction has a fourth value. The fourth value of the interaction identifies both the first chassis and the selected slot into which the removable card is inserted.

In various embodiments, the first value and the second value vary by a known amount within a common order of magnitude of the values, and the known amount is used to determine the slot identification and the common order of magnitude is used to determine the chassis identification. In some embodiments, the first electrical component and the second electrical component comprise resistors. In some embodiments, the first electrical component and the second electrical component comprises capacitors. In some embodiments, the first electrical component and the second electrical component comprise a combination of resistors and capacitors. In some embodiments, the measuring circuit comprises a voltage divider circuit. Some embodiments include a lookup table for determining the slot identification and the chassis identification based at least in part on the interaction between third electrical component and the associated one of the first electrical component and the second electrical component. In some embodiments, the measuring circuit is disposed on the removable card. In some embodiments, different chassis are distinguished one from another by having first and second components that vary from chassis to chassis by different orders of magnitude. In some embodiments, the input signal comprises at least one of a known voltage and a known current.

According to another aspect of the invention there is described a method for determining a chassis identification and a slot identification within the chassis using a single reading. A first electrical component is associated with a first slot of a first chassis, the first electrical component having a first value. A second electrical component is associated with a second slot of the first chassis, the second electrical component having a second value different from the first value. A removable card is inserted into a selected one of the first slot or the second slot of the first chassis, the removable card having a third electrical component having a third value. An input signal is applied to the selected one of the first electrical component and the second electrical component. An interaction is measured between the third electrical component and the first selected one of the first electrical component and the second electrical component, and compared to a table of values to determine a chassis identification and a slot identification.

According to yet another aspect of the invention there is described a method for determining a chassis identification and a slot identification within the chassis using a single reading. A first electrical component is associated with a first slot of a first chassis, where the first electrical component has a first value. A second electrical component is associated with a second slot of the first chassis, where the second electrical component has a second value that is different from the first value. The first value and the second values vary by a first known amount within a first common order of magnitude of the first and second values.

Similarly, a fourth electrical component is associated with a first slot of a second chassis, where the fourth electrical component has a fourth value. A fifth electrical component is associated with a second slot of the second chassis, where the fifth electrical component has a fifth value that is different from the fourth value. The fourth value and the fifth values vary by a second known amount within a second common order of magnitude of the fourth and fifth values. The first common order of magnitude is different from the second common order of magnitude.

A removable card is inserted into a selected one of the first, second, third, and fourth slots, where the removable card has a third electrical component with a third value. An input signal is applied to the selected one of the first, second, third, and fourth electrical component, and an interaction between the third electrical component and the selected one of the first, second, third, and fourth component is measured and compared to a table of values to determine a chassis identification and a slot identification, where the known amount is used to determine the slot identification and the common order of magnitude is used to determine the chassis identification.

DRAWINGS

Additional objects and features of the disclosure will be more readily apparent from the following detailed description and appended claims when taken in conjunction with the drawings, in which:

FIG. 3 is a lookup table for identifying the chassis and slot of the chassis according to an embodiment of the invention.

DESCRIPTION

Figure 1:
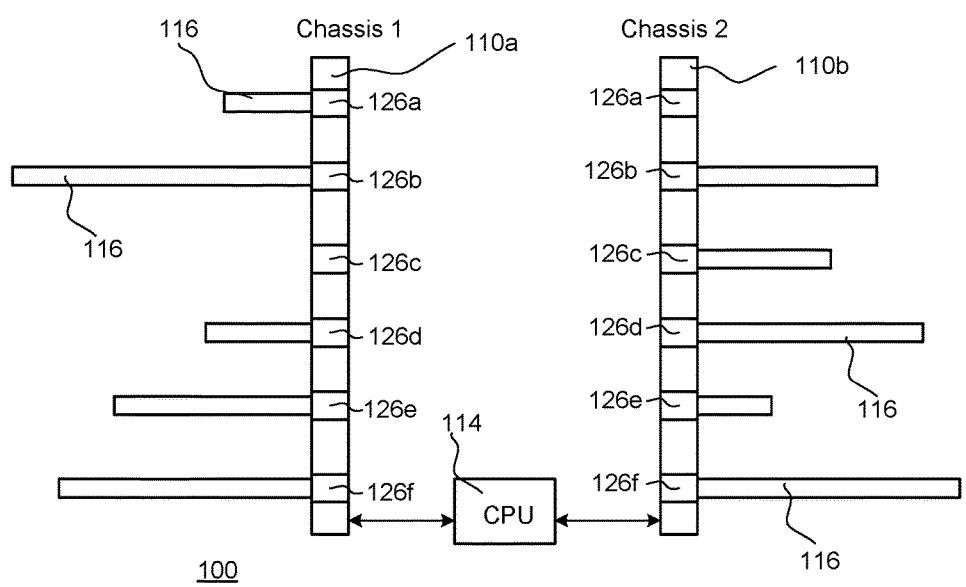
FIG. 1 is a functional block diagram of two chassis connected to a central processing unit according to an embodiment of the invention.

With reference to FIG. 1, various embodiments of the present invention enable a card 116 to determine not only the identity of the slot 126 in which the card 116 is disposed, but to also determine identifying information in regard to the chassis 110 in which the slot 126 is disposed. Thus, embodiments of the present invention are applicable to a single chassis 110 that is not dependent upon any other computer system or directly connected to any other computer system or chassis 110. Other embodiments are applicable to computer systems in which more than one chassis 110 is connected together in a cohesive computer system 100, as depicted.

The embodiment of the computer system 100 depicted in FIG. 1 has two different types of chassis 110a and 110b. The computer system 100 may contain more interchangeable chassis 110. However, for illustration purposes, only two are shown connected to the same central processing unit 114. Each chassis 110 has multiple slots 126, and may contain any number of slots 126. For illustration purposes, each chassis 110 is shown with only six slots 126. The slots 126 may be empty or may contain cards 116.

Figure 2:
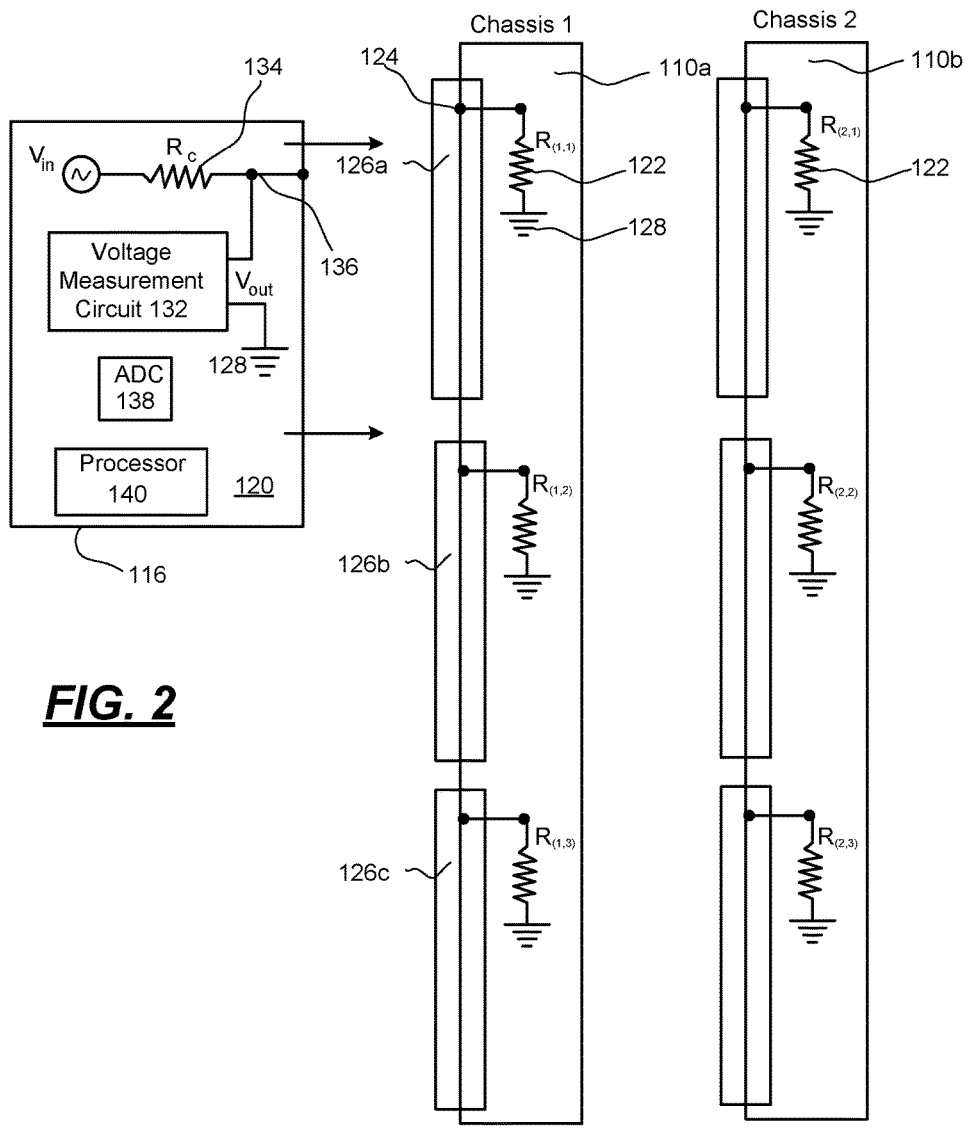
FIG. 2 is a functional block diagram of a circuit for use in determining the identity of a chassis and the slot location of a card in the chassis according to an embodiment of the invention.

As shown in the embodiment of FIG. 2, the card 116 includes an identification circuit 120 that is used to identify both the slot 126 and the chassis 110 in which the card 116 is disposed. In FIG. 2, portions of each of the chasses 100 are illustrated. Chassis 110a includes resistors $R_{(1,1)}$ through $R_{(1,3)}$ that are used in one embodiment to identify the chassis 110a and the slot 126 occupied by the card 116. Likewise, chassis 110b includes resistors $R_{(2,1)}$ through $R_{(2,3)}$ that are used to identify chassis 110b and the slot 126 occupied by another card 116. In this embodiment, a voltage divider circuit 120 is used to identify both the chassis 110 and the slot 126 in the chassis 110 according to the following formula:

$$V_{out} = V_{in} * \left( \frac{R_{(x,y)}}{R_c + R_{(x,y)}} \right)$$

where $V_{out}$ is the measured output voltage, $V_{in}$ is the known input voltage, $R_c$ is the known resistor value on the card 116, and $R_{(x,y)}$ are the different resistor values for each slot 126 in each chassis 110. The input voltage $V_{in}$ is applied through the resistor circuit and the output voltage $V_{out}$ is measured. The output voltage $V_{out}$ is used as an entry into a lookup table such as depicted in FIG. 3 to determine which chassis 110 and slot 126 the card 116 is connected to. This is possible because the values of the resistors $R_C$ and $R_{(x,y)}$ and the value of the input voltage $V_{in}$ are selected such that the output voltage $V_{out}$ will have a unique value for each combination of chassis 110 and slot 126.

Likewise, if the input and output voltages are known, the unknown resistor value $R_{(x,y)}$ may be determined by the above formula and may be used to identify the slot 126 location and chassis 110 identity according to the lookup table in FIG. 3. In the foregoing illustration, the resistors $R_{(x,y)}$ of chassis 110a have values ranging from 1-11Ω associated with slots 126a-f respectively, while the resistors of chassis 110b have values ranging from 20-110Ω.

The use of different ranges of resistor values $R_{(x,y)}$ for each chassis 110 enables an analog signal to be used to determine both the chassis 110 and the slot 126 in the chassis 110. In other words, one piece of information can be carried in the order of magnitude value of the resistor $R_{(x,y)}$, such as 10's, 100's, 1000's, etc., and another piece of information can be carried in the value of the resister $R_{(x,y)}$ within the order of magnitude, such as 10, 11, 12, 13, 100, 110, 120, 130, 1000, 1100, 1200, 1300, and so forth. In this manner, at least two pieces of identifying information is carried by a single resistor value.

For example, the type of chassis 110 in which the card is disposed is, in one embodiment, indicated by the order of magnitude of the value of the resistor $R_{(x,y)}$, such that one type of chassis 110 has slots with resistors $R_{(x,y)}$ that are all encoded within the order of magnitude of 1000, such as 1010, 1020, 1030, and so forth. When the circuit 120 detects the order of magnitude value of the resistor $R_{(x,y)}$, it understands that the chassis 110 is of a type that is associated with that order of magnitude value. Similarly, When the circuit 120 detects the order of magnitude value of the resistor $R_{(x,y)}$ is within the order of magnitude of 10000, such as 10100, 10200, 10300, and so forth, it understands that the chassis 110 is of another type that is associated with that order of magnitude value.

To continue the examples, when the circuit 120 detects that the values of the resistors $R_{(x,y)}$ within a given order of magnitude are different, such as 1010, 1020, and 1030, it interprets the change in resistance within the order of magnitude (in this case 10, 20, and 30) to be an identification of the slot 126 within the chassis 110 in which the card 116 is disposed.

Differentiation of two pieces (or more) of information by using orders of magnitude are one embodiment of the present invention, and other embodiments are contemplated herein. Similar identification of chassis 110 and slot 126 can be achieved with circuits that include capacitors in place of resistors, or with a combination of resistors and capacitors, and the like. Such circuits 120 are well known to those skilled in the art.

In some embodiments, the address for each slot 126 is identified with an analog signal rather than a digital signal.

The analog signal is a function of the card 116 coupled to the address pin 124 for each slot 126 and for each chassis 110 that is used. As shown in FIG. 2 for example, there is a resistor 122 coupled at a first end to the address pin 124 for each slot 126 of the chassis 110, with the second end of the resistor 122 coupled to a circuit ground node 128. The slot resistors 122 for each of the slots 126 have different values, and the range of values for slot resistors 122 on chassis 110b differs in one embodiment by an order of magnitude from the slot resistors 122 on chassis 110a, as indicated in the table of FIG. 3, such that there is a measurably different voltage drop across each resistor 122.

The card resistor 134 is coupled to the slot resistor 122 of the chassis 110 into which the card 116 is inserted, through the address pin 124. The two resistors 134 and 122 form a resister divider circuit having a common node 136. The end of the card resistor 134 that is not coupled to node 136 is tied to the supply voltage $V_{in}$. The output of the divider circuit on node 136 is a voltage $V_{out}$, which is a function of the unique value of the slot resistor 122 and the value of the card resistor 134, which may be the same for each card 116. The signal $V_{out}$ is input in one embodiment to a voltage measurement circuit 132, which determines the value of $V_{out}$, such as by referencing it to the ground 128.

In some embodiments an analog-to-digital converter 138 outputs a unique digital identifier for the card 116, indicating the slot 116 and chassis 110 identification. Alternately, the analog-to-digital converter 138 outputs a digital value that is then converted by a processor 140 on the card 116 into a unique digital identifier for the card 116 in accordance with a predefined mapping function.

In addition to providing card 116 information, the analog identification signal can be used in some embodiments to identify error conditions. For example, if there is an open pin failure, the analog signal will be equal to the supply voltage- in the present example, a ten volt DC value. The value of zero volts may be reserved to identify other error conditions, such as a shorted pin or an open card resistor.

In one embodiment, the values of the slot resistors 122 are selected exponentially, such that the voltage values for the analog signal are linear. However, it is also possible to select the slot resistors 122 in a linear fashion to obtain an exponential voltage. Alternately, arbitrary slot resistor 122 values may be used, so long as there is a measurably unique analog signal for each slot 126 and each chassis 110. Resolution of the analog information signal is limited only by the precision of the slot resistors 122 and the card resistor 134, and the accuracy of the analog-to-digital converter 138. In other embodiments, the card resistor 134 may be tied to a current source rather than a voltage source. The voltage at the output of the current source is input to an analog-to-digital converter 138, which outputs a unique digital identifier. This approach results in linear voltage values when the resistor values are selected in a linear fashion.

In another embodiment, the current, rather than the voltage, may be determined by a measuring circuit 120. Given a unique value for the slot resistor 122, the current at the measuring circuit 120 will also be unique and therefore suitable for providing a unique slot and chassis identification.

In the above examples, the slot and chassis identification is determined using either voltage or current. However, the identification could also be a waveform such as a sinusoid or a pulse, with the identification contained in a non-zero frequency component of the signal. The component coupled to the address pin 124 for each slot 126 could be a component with a response that varies as a function of frequency, such as a capacitor or an inductor. For example, a capacitor with a unique value could be coupled to each slot 126, to shift the frequency of a sinusoidal waveform or to delay a pulse. Similarly, a voltage or current ramp could be used, with the slope of the ramp varying as a function of the component coupled to the address pin. Again, the component would have a response which varies as a function of frequency, such as a capacitor or an inductor. For example, a capacitor to ground could be coupled to each slot address pin 124 with the source of the ramped voltage or current on the card 116 coupled to the capacitor. The ramp slope would then be inversely related to the capacitance. The signal could be converted to digital form and the slope could be measured by a processor following the digital-to-analog converter. So long as the slope of the ramp could be uniquely determined for each slot 116 and chassis 110, the slot 126 and chassis 110 identification can be determined.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. An identification circuit for determining a chassis identification and a slot identification within the chassis using a single reading, the circuit comprising:
    a first electrical component associated with a first slot of a first chassis, the first electrical component having a first value that identifies both the first chassis and the first slot,
    a second electrical component associated with a second slot of the first chassis, the second electrical component having a second value different from the first value and that identifies both the first chassis and the second slot,
    a removable card having a third electrical component having a third value, the removable card for insertion into a selected one of the first slot and the second slot of the first chassis,
    a measuring circuit for measuring an interaction between the third electrical component and the associated one of the first electrical component and the second electrical component, the interaction having a fourth value,
    where the fourth value of the interaction identifies both the first chassis and the selected slot into which the removable card is inserted, where different chassis are distinguished one from another by having first and second electrical components that vary from one chassis to another chassis, and
    the first value and the second value vary by a known amount within a common order of magnitude of the values, and the known amount is used to determine the slot identification and the common order of magnitude is used to determine the chassis identification.

2. The identification circuit of claim 1, wherein the first electrical component and the second electrical component comprise resistors.

3. The identification circuit of claim 1, wherein the first electrical component and the second electrical component comprises capacitors.

4. The identification circuit of claim 1, wherein the first electrical component and the second electrical component comprise a combination of resistors and capacitors.

5. The identification circuit of claim 1, wherein the measuring circuit comprises a voltage divider circuit.

6. The identification circuit of claim 1, further comprising a lookup table for determining the slot identification and the chassis identification based at least in part on the interaction between third electrical component and the associated one of the first electrical component and the second electrical component.

7. The identification circuit of claim 1, wherein the measuring circuit is disposed on the removable card.

8. The identification circuit of claim 1, wherein different chassis are distinguished one from another by having first and second components that vary from chassis to chassis by different orders of magnitude.

9. A method for determining a chassis identification and a slot identification within the chassis using a single reading, the method comprising the steps of:
providing a first electrical component associated with a first slot of a first chassis, the first electrical component having a first value that identifies both the first chassis and the first slot,
providing a second electrical component associated with a second slot of the first chassis, the second electrical component having a second value different from the first value and that identifies both the first chassis and the second slot,
inserting a removable card into a selected one of the first slot or the second slot of the first chassis, the removable card having a third electrical component having a third value,
applying an input signal to the selected one of the first electrical component and the second electrical component,
measuring an interaction between the third electrical component and the first selected one of the first electrical component and the second electrical component, and
comparing the interaction to a table of values to determine a chassis identification and a slot identification, where different chassis are distinguished one from another by having first and second electrical components that vary from one chassis to another chassis,
wherein different chassis are distinguished one from another by having first and second components that vary from chassis to chassis by different orders of magnitude.

10. The method of claim 9, wherein the first value and the second value vary by a known amount within a common order of magnitude of the values, and the known amount is used to determine the slot identification and the common order of magnitude is used to determine the chassis identification.

11. The method of claim 9, wherein the first electrical component and the second electrical component comprise resistors.

12. The method of claim 9, wherein the first electrical component and the second electrical component comprises capacitors.

13. The method of claim 9, wherein the first electrical component and the second electrical component comprise a combination of resistors and capacitors.

14. The method of claim 9, wherein the measuring circuit comprises a voltage divider circuit.

15. The method of claim 9, further comprising a lookup table for determining the slot identification and the chassis identification based at least in part on the interaction between third electrical component and the associated one of the first electrical component and the second electrical component.

16. The method of claim 9, wherein the measuring circuit is disposed on the removable card.

17. The method of claim 9, wherein the input signal comprises at least one of a known voltage and a known current.

18. A method for determining a chassis identification and a slot identification within the chassis using a single reading, the method comprising the steps of:
providing a first electrical component associated with a first slot of a first chassis, the first electrical component having a first value that identifies both the first chassis and the first slot,
providing a second electrical component associated with a second slot of the first chassis, the second electrical component having a second value different from the first value and that identifies both the first chassis and the second slot,
where the first value and the second value vary by a first known amount within a first common order of magnitude of the first and second values,
providing a fourth electrical component associated with a first slot of a second chassis, the fourth electrical component having a fourth value that identifies both the second chassis and the first slot,
providing a fifth electrical component associated with a second slot of the second chassis, the fifth electrical component having a fifth value different from the fourth value and that identifies both the second chassis and the second slot,
where the fourth value and the fifth value vary by a second known amount within a second common order of magnitude of the fourth and fifth values, and the first common order of magnitude is different from the second common order of magnitude,
inserting a removable card into a selected one of the first, second, third, and fourth slots, the removable card having a third electrical component having a third value,
applying an input signal to the selected one of the first, second, third, and fourth electrical component,
measuring an interaction between the third electrical component and the selected one of the first, second, third, and fourth component, and
comparing the interaction to a table of values to determine a chassis identification and a slot identification, and the first and second known amounts are used to determine the slot identification and the first and second common orders of magnitude are used to determine the chassis identification.

* * * * *